(12) United States Patent
Feigenbaum et al.

(10) Patent No.: US 7,504,839 B2
(45) Date of Patent: Mar. 17, 2009

(54) FLEXIBLE CIRCUIT WITH MICRO-SIZED PROBE TIPS AND A METHOD OF MAKING THE SAME

(75) Inventors: Haim Feigenbaum, Irvine, CA (US); Bao Q. Le, Santa Ana, CA (US); Long T. Hoang, Orange, CA (US); Robert K. Betz, Huntington Beach, CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/956,318

(22) Filed: Oct. 1, 2004

(65) Prior Publication Data

US 2006/0071677 A1   Apr. 6, 2006

(51) Int. Cl.
*G01R 31/26* (2006.01)
(52) U.S. Cl. ..................................................... 324/754
(58) Field of Classification Search ......... 324/754–762; 439/482
See application file for complete search history.

(56) References Cited

U.S. PATENT DOCUMENTS

| | | | | |
|---|---|---|---|---|
| 4,593,243 A | * | 6/1986 | Lao et al. | 324/754 |
| 4,599,559 A | * | 7/1986 | Evans | 324/754 |
| 4,672,312 A | * | 6/1987 | Takamine et al. | 324/754 |
| 5,225,777 A | * | 7/1993 | Bross et al. | 324/754 |
| 5,977,783 A | * | 11/1999 | Takayama et al. | 324/754 |
| 5,990,695 A | | 11/1999 | Daugherty, Jr. | |
| 6,313,402 B1 | | 11/2001 | Schreiber et al. | |

* cited by examiner

*Primary Examiner*—Vinh P. Nguyen
(74) *Attorney, Agent, or Firm*—David P. Wood

(57) ABSTRACT

A flexible circuit includes a plurality of electrical traces and a plurality of probe tips directly formed thereto. The electrical traces are made of a first electrically conductive material and the probe tips are made of a second electrically conductive material that is harder than the first electrically conductive material. The first material is copper or a copper alloy and the second material is nickel or a nickel alloy, where the second material may be plated with gold. Portions of the probe tips are exposed to facilitate electrical contact with contact pads of another electrical circuit. The flexible circuit may also include a ground layer to facilitate electrical correction with another electrical circuit at relatively high frequencies.

11 Claims, 3 Drawing Sheets ically conductive material. At least a portion of the probe tips are substantially exposed on the flexible circuit to facilitate electrical contact of the probe tips to the device under test.

FLEXIBLE CIRCUIT WITH MICRO-SIZED PROBE TIPS AND A METHOD OF MAKING THE SAME

FIELD OF THE INVENTION

This invention relates to flexible circuits and more particularly to a flexible circuit including micro-sized probe tips formed thereon and to a method of making the same.

BACKGROUND OF THE INVENTION

Flexible circuits are often used for interconnection of electrical signals between various miniature electrical components. A flexible circuit is generally composed of a collection of flexible electrically conductive traces formed on a flexible electrically insulating support structure or substrate. When used as testing or probing circuits, the flexible circuit further includes a plurality of small probes generally mechanically attached to the traces of the flexible printed circuit. The probes electrically contact a second electrical circuit, for example an integrated circuit (IC) wafer or the like, by touching contact or bond pads formed thereon. Signals are then read by the flexible circuit to determine the integrity of the circuit formed on the IC wafer.

Currently, low cost testing procedures and technologies are being sought to accommodate a recent demand for producing smaller, more complex and less costly electrical circuits. The probes formed on the flexible circuit, which are consequently reduced in size to accommodate the smaller pitch between bond pads, cannot easily be fixed to the flexible circuit in proper position and orientation using conventional welding or soldering techniques.

Thus, it is an object of the present invention to provide a flexible circuit including micro-sized probe tips that make effective electrical connections with smaller, more complex electrical circuits. It is a further object of the present invention to provide a method of fabricating a flexible circuit including micro-sized probe tips that meet the testing requirements of the smaller and more complex circuits where the fabrication method is economically feasible.

SUMMARY OF THE INVENTION

The present invention provides a flexible circuit including a plurality of electrical traces and a plurality of probe tips directly formed thereto. The electrical traces are made of a first electrically conductive material and the probe tips are made of a second electrically conductive material that is harder than the first electrically conductive material. At least a portion of the probe tips are substantially exposed on the flexible circuit to facilitate electrical contact of the probe tips to the device under test.

Also in accordance with the present invention is a method of making a flexible circuit including forming a plurality of electrical traces on a carrier and then directly forming a plurality of probe tips to the electrical traces. The electrical traces are made of a first electrically conductive material and the probe tips are preferably made of a second electrically conductive material that is harder than the first electrically conductive material. The carrier is then removed from the electrical traces and the probe tips and then at least a portion of the probe tips are substantially exposed on the flexible circuit.

BRIEF DESCRIPTION OF THE DRAWINGS

Objects, features and advantages of the present invention will be apparent from the following detailed description of the preferred embodiments and best mode, appended claims and accompanying drawings in which:

DESCRIPTION OF THE INVENTION

Figure 1:
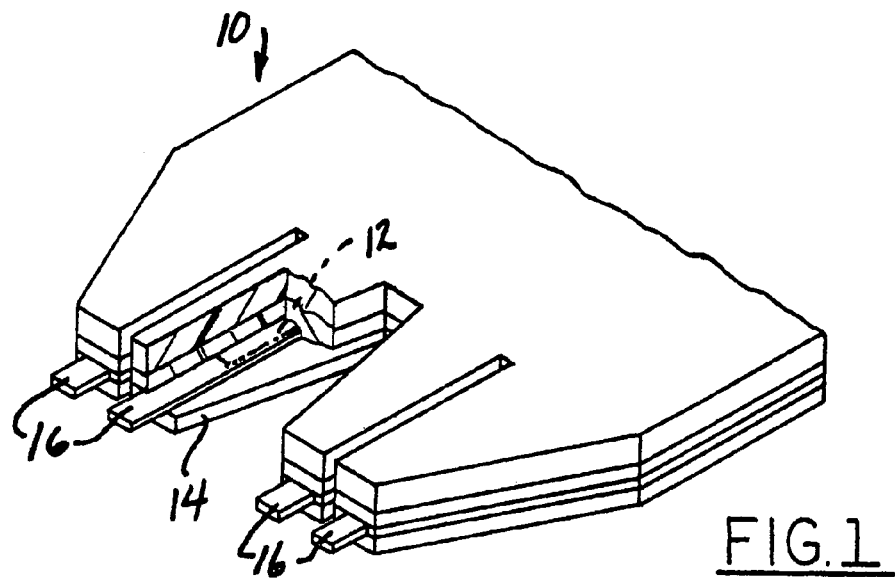
FIG. 1 is a perspective view of a cut-off portion of a flexible circuit of the present invention.

Referring in more detail to the drawings, FIG. 1 discloses a flexible circuit 10 including a plurality of electrical traces 12 (only one shown in FIG. 1) supported on a flexible substrate layer 14, wherein micro-sized probe tips 16 are directly formed to the electrical traces 12 (one shown) using modified flexible printed circuit board (PCB) and mandrel processes. The flexible circuit 10 is particularly suited for use in IC wafer probing applications, but may also be used in other applications requiring micro-sized probe tips for contacting miniature contact points on a second electrical circuit to complete an electrical connection.

The substrate layer 14 is a layer of about 35 to 65 micrometers in thickness, and more preferably, about 50 micrometers in thickness, and is composed of a flexible polymeric material that can support the electrical traces 12 on a generally flat plane. Suitable materials for the substrate 14 include polymers particularly of the polyimide family.

The electrical traces 12 overlie the substrate layer 14 and are formed in a pattern thereon to electrically connect one or more electrical components formed on the flexible circuit 10. Electrical traces 12 have substantially parallel end portions for making electrical connections. The electrical traces 12 may be composed of any conductive, flexible material including metals and conductive inks. Preferably, the electrical traces 12 are made of a copper metal, and more preferably of pure copper or a copper alloy, and should have a Vickers hardness value in the range of 100 to 120 VPN.

The probe tips 16, also commonly referred to as conduction needles, pins or fingers, are directly formed, preferably by electroplating, to the end portions of the electrical traces 12. The probe tips 16 are essentially protrusions that extend outwardly from the electrical traces 12. The probe tips 16 are approximately 40 to 60 micrometers in length and 40 to 60 micrometers in thickness, and more preferably, about 50 micrometers in length and about 50 micrometers in thickness. The probe tips 16 are preferably made of an electrically conductive material that is harder than the material of the electrical traces 12, where the material has a Vickers hardness value in the range of 180 to 400 VPN.

The probe tips 16 are generally oriented or positioned at an end portion 18 of each electrical trace 12 and the several probe tips 16 are patterned for suitable electrical contact with several respective electrical contacts of second electrical circuit (not shown). The suitable contact between the two circuits contributes to reduced damage of the electrical circuit and better test readings.

The flexible circuit 10 of the present invention is fabricated using flexible printed circuit board (PCB) and mandrel processes. With reference now to FIGS. 2-11, a fabrication assembly 20 includes a mandrel 22 made of stainless steel and used to form the flexible circuit 10 shown in FIG. 1. Starting with FIGS. 2-4, the entire surface of the mandrel 22 is covered, by a method commonly referred to as flash plating, with a copper metal to form an extremely thin, i.e., 1 to 5 micrometers in thickness, copper coating layer 24. Generally, flash plating is a conventional electrolytic plating method wherein a thin plating coat is formed in a very short or momentary operation. Other methods of coating the mandrel 22 with a thin coat of conductive material may be employed in the place of the electrolytic flash plating method.

A photoresist (not shown) is then coated on the copper coat layer 24 and the copper coated mandrel 22 is then subjected to a photolithographic process, where the photoresist coating is optically exposed through a mask defined by a pattern of the desired circuit pattern including the electrical traces 12 and is then developed. The photoresist that is not polymerized is then removed to leave the copper coating layer 24 that now bears a pattern of photoresist that is a negative pattern of the circuit trace pattern to be fabricated with the mandrel 22.

Figure 2:
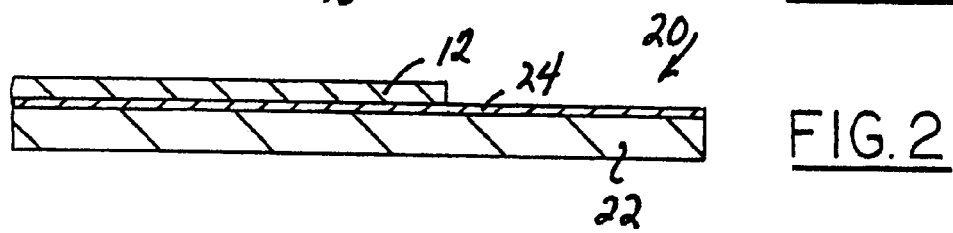
FIG. 2 is a cross-sectional side view of a fabrication assembly for making the flexible circuit of FIG. 1.
Figure 3:
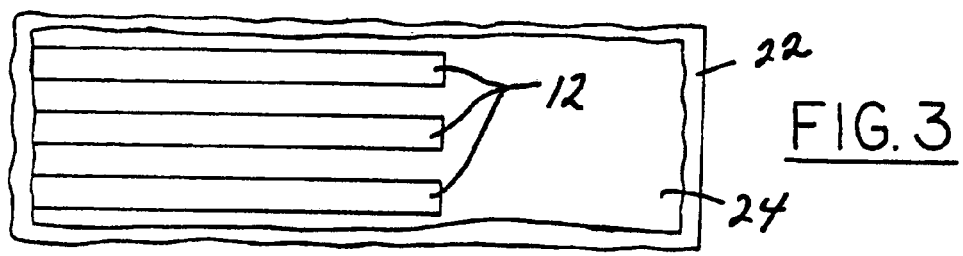
FIG. 3 is a top view of the fabrication assembly of FIG. 2.
Figure 4:
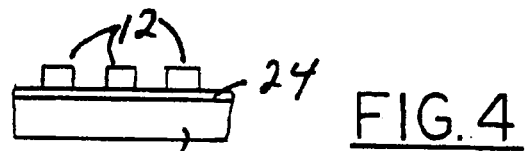
FIG. 4 is an end view of the fabrication assembly of FIG. 2.

Then the copper coating layer 24 is subjected to a suitable additive electroforming process to plate up the electrical traces 12 also made of copper. The traces 12 are plated directly onto those portions of the flash plated copper coating layer 24 that are not covered by the pattern of the developed photoresist. As shown in FIGS. 2, 3 and 4, the residual photoresist is then stripped off of the copper coat 24, thereby leaving the electrical traces 12 formed onto the flash plated copper coat 24.

Figure 5:
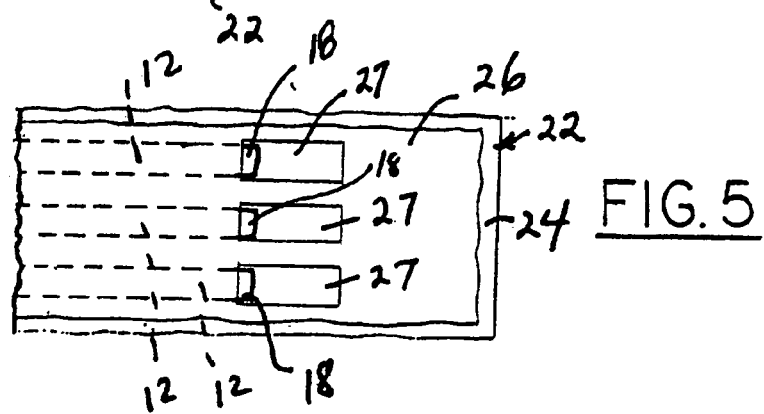
FIG. 5 is a top view of a later fabrication assembly in the method of making the flexible circuit of FIG. 1.

As shown in FIG. 5, a second photoresist coating is then applied to the entire exposed surface of the copper coating layer 24 and the electrical traces 12. The mandrel 22 is then subjected to another photolithographic process, where the photoresist coating is optically exposed through another mask defined by a desired pattern of the probe tips and is then developed. The photoresist that is not polymerized is then removed to leave a photoresist coating layer 26 with openings 27 that is a negative pattern of the probe tips to be fabricated with the mandrel 22.

Figure 6:
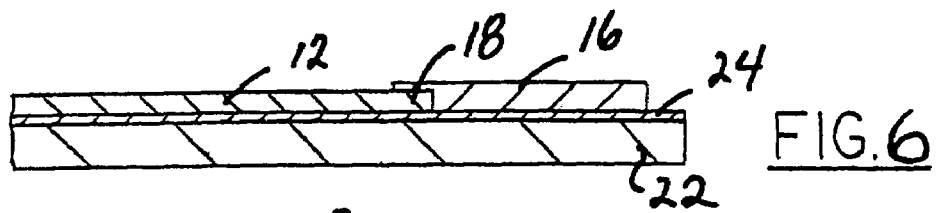
FIG. 6 is a cross-sectional side view of a still later fabrication assembly in the method.

As shown in FIG. 6, a relatively thick layer of nickel is then directly formed, preferably electroplated, to the portions of copper coating layer 24 and the electrical traces 12 that are exposed by the openings 27 bearing the probe tip pattern. As shown in FIG. 6 the nickel is electroplated over the end portions 18 of the electrical traces 12, thereby forming the probe tips 16. The nickel material is desirably used for the probe tips 16 because the material is suitably electrically conductive, yet hard and durable, which is especially useful for micro probing processes. Copper, on the other hand, is softer and more easily deformable, which is problematic for use as a probe tip since pressure is often exerted on the probe tip when contacted with a bond pad of an IC wafer, for example. Such pressure, in the presence of heat, may cause a copper probe tip of the prior art to deform and give false readings in subsequent tests.

Figure 8:
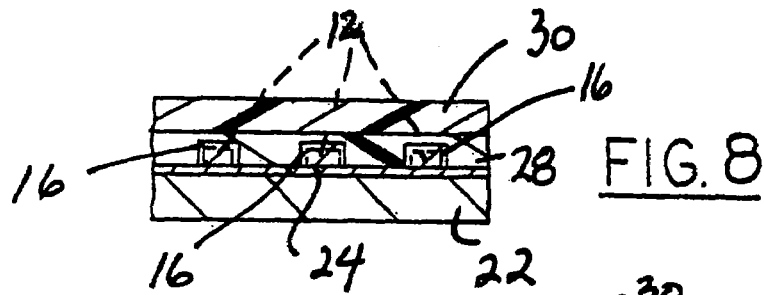
FIG. 8 is a cross-sectional side view taken substantially along line 8-8 of FIG. 7 looking in the direction of the arrows.
Figure 9:
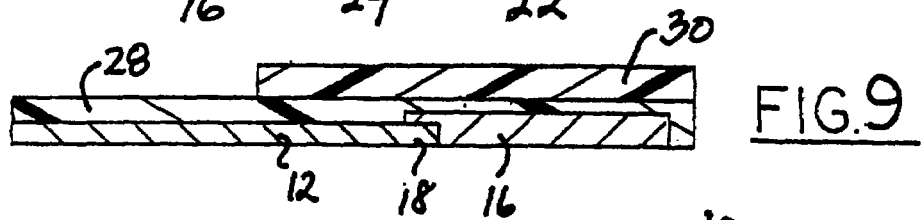
FIG. 9 is a cross-sectional side view of a still later fabrication assembly in the method of making the flexible circuit of FIG. 1.
Figure 10:
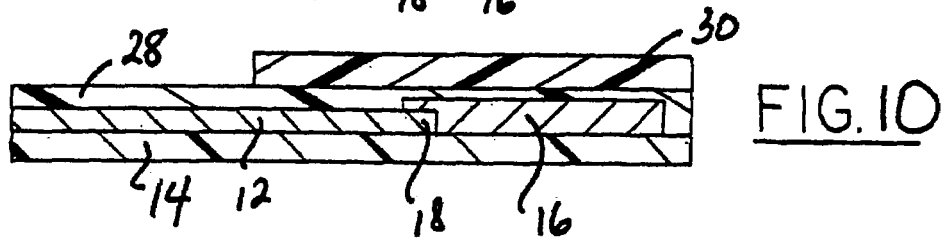
FIG. 10 is a cross-sectional side view of a still later fabrication assembly in the method.
Figure 7:
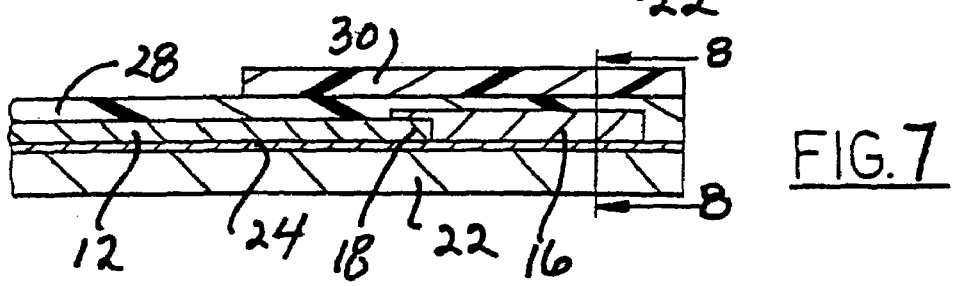
FIG. 7 is a cross-sectional side view of a still later fabrication assembly in the method.

With reference now to FIGS. 7 and 8, a cover layer is then laminated over the copper coating layer 24, the electrical traces 12 and the probe tips 16 carried by the mandrel 22 under suitably high temperatures and pressures using a flexible polymeric material. Preferably, the polymeric material used is the same polyimide material that is used for the substrate layer 14. The copper coating layer, the electrical traces 12 and the nickel probe tips 16 are completely covered by the polyimide material and laminated thereto to form a coated cover layer 28, commonly referred to as a transfer cover, of about 35 to 65 micrometers in thickness, and more preferably about 50 micrometers. Then a stiffener layer 30, preferably made of the same polyimide material, is formed over the end portion of the transfer cover layer 28 covering the probe tips and the end portions of the electrical traces 12. The stiffener layer 30 has a thickness of about 115 to 140 micrometers, and more preferably about 125 micrometers. The relatively thick stiffener layer 30 provides a robust end portion of the flexible circuit 10 holding the probe tips 16 firmly in place on the ends 18 of the electrical traces, especially when contacting electrical contacts on a second circuit. Thereafter, the mandrel 22 is removed, as shown in FIG. 9, and the thin copper coating layer 24 is flashed away exposing the bottoms of the electrical traces 12 and the nickel probe tips 16.

Figure 11:
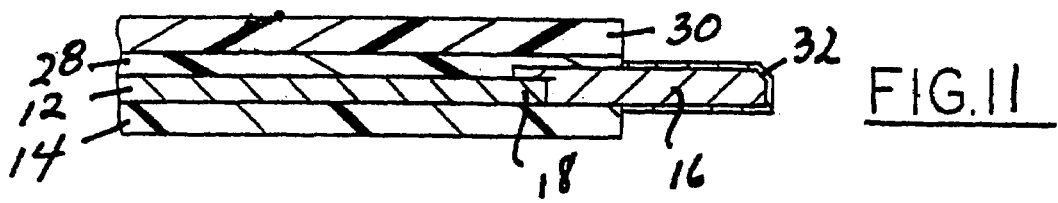
FIG. 11 is a cross-sectional side view of a still later fabrication assembly for the flexible circuit of FIG. 1.

The resulting fabrication assembly is then laminated to another insulation layer at suitably high temperatures and pressures to thereby form the substrate layer 14 located below the electrical traces 12 and the probe tips 16. Thereafter, the end of the fabrication assembly is shaped and the probe tips 16 are exposed using a laser process known as ablation, where portions of the transfer cover 28, the stiffener layer 30 and the substrate layer 14 are essentially evaporated, thereby leaving exposed nickel probe tips 16 unharmed to provide the flexible circuit 10 shown in FIG. 1. The exposed nickel probe tips 16 are then preferably plated with a thin gold layer 32, as shown in FIG. 11. Gold is an electrically conductive material preferable for use in electrical circuitry for optimal electrical contact between two electrical components.

Figure 12:
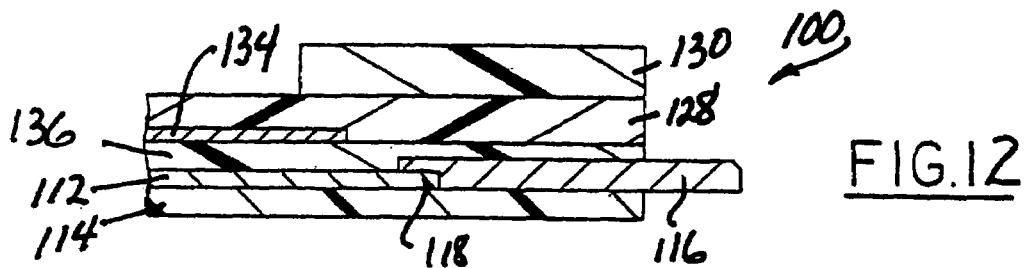
FIG. 12 is a cross-sectional side view of a fabrication assembly for a second embodiment of the flexible circuit of the present invention.

With reference now to FIG. 12, the second embodiment of the present invention is a flexible circuit 100 that is similarly constructed. The flexible circuit 100 includes a plurality of electrical traces 112 supported on a flexible substrate layer 114, wherein micro-sized probe tips 116 are directly formed to the electrical traces 112 at end portions 118 of the electrical traces 112 using the same process described above in connection with flexible circuit 10. The flexible circuit 100 of the second embodiment however, further includes a conductive ground layer 134 to permit more accurate electrical communication of a second electrical circuit at relatively high frequencies. The ground layer 134 is formed substantially above the electrical traces 112 with an intermediate laminate insulation layer 136 preferably made of a polyimide, laminated over the electrical traces 112 and probe tips 116 to form a base for the ground layer 134. The ground layer 134 is especially useful for circuit testing or probing at high frequencies because high frequencies may create impedance mismatch, which in turn can create a high amount of electrical noise. Thus, the impedance of a circuit can be controlled to reduce the noise level for obtaining more accurate test readings of the second electrical circuit. The flexible circuit 100 further includes a transfer cover 128 and a stiffener layer 130 laminated over the ground layer 134. The ground layer 134 which may be a plane or a trace is electrically connected to various ones of the electrical traces 112 and/or probe tips 116 by conventional vias (not shown) that are drilled, preferably by lasers, through the transfer cover 128 and then electroplated with copper.

Figure 13:
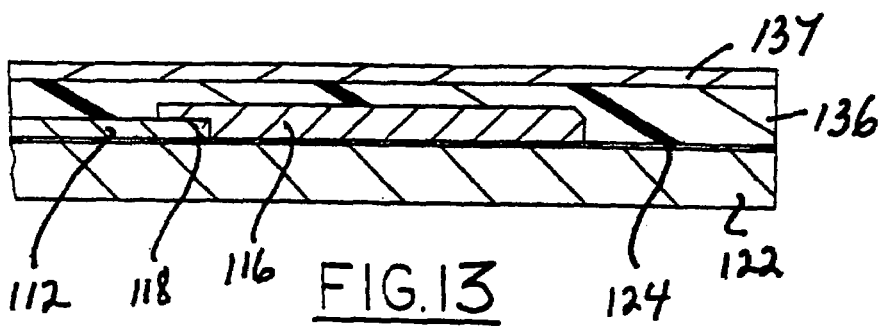
FIG. 13 is a cross-sectional side view of an earlier fabrication assembly for the second embodiment of the flexible circuit of the present invention.
Figure 14:
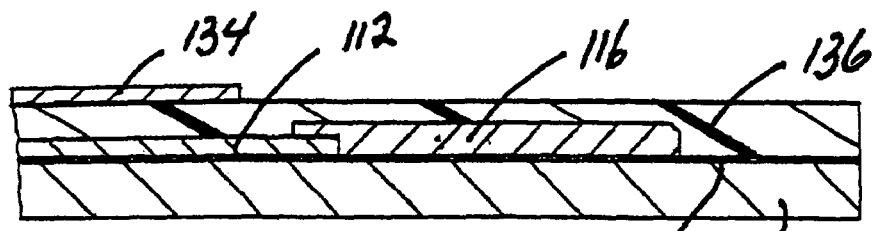
FIGS. 14 and 15 are cross-sectional side views of intermediate fabrication assemblies of the second embodiment.

As previously mentioned, the process of fabricating the flexible circuits 100 of the second embodiment of the present invention is generally the same as the fabrication process of the flexible circuit 10 of the first embodiment; The process however, is modified to include forming the ground layer 134 and the laminate coating layer 136 as shown in FIGS. 13-15.

The copper coating layer 124, electrical traces 112 and probe tips 116 are fabricated on mandrel 122 in exactly the same way as the copper coating layer 24, electrical traces 12 and probe tips 16 are fabricated on mandrel 22 which is described above in connection with FIGS. 2-6. At this point, the intermediate laminate layer 136 is laminated over the copper coating layer 124, the electrical traces 112 and the probe tips 116 at suitably high temperatures and pressures as shown in FIG. 13. The thickness of the laminate layer 136 is about 35 to 65 micrometers, and more preferably about 50 micrometers in thickness.

A thin layer of copper 137 is then laminated over the intermediate laminate insulation layer 136. If a general trace rather than a ground plane is desired, then a photoresist (not shown) is coated over the copper layer 137 and subjected to a photolithographic process, where the photoresist is optically exposed through a mask defined by a pattern of the desired ground trace pattern and then developed. The photoresist that is not polymerized is then removed to leave the copper layer 137 bearing a pattern of photoresist that is a pattern of the desired ground trace 134. The thin layer of copper 137 is then etched leaving the ground trace 134 beneath the pattern of photoresist. The residual photoresist is then stripped off with the unetched portion of the copper layer 137 forming the ground trace layer 134.

Figure 15:
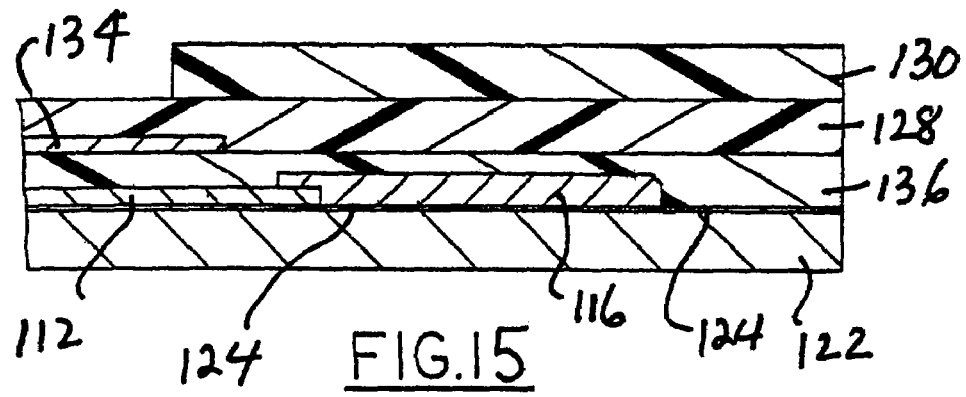

As shown in FIG. 15, the transfer cover 128 is then laminated over the ground trace 134 and thereafter the stiffener 130 is laminated over the transfer cover 128 in the same way that the transfer cover 28 and the stiffener 30 are formed in the first embodiment. The mandrel 122 is then removed and the copper coating layer 124 is etched or flashed away. Similar to that disclosed for the first embodiment in conjunction with FIGS. 10 and 11, the substrate 114 is then laminated onto the bottom of the intermediate layer 136. The end is then shaped exposing the probe tips 116 to complete the flexible circuit 100 as shown in FIG. 12. If desired the exposed probe tips 116 may be gold plated.

The flexible circuit of the present invention can advantageously be used for reliable electrical connection with a second, miniature electrical circuit. Such connection by the probe tips of the flexible circuit with the miniature electrical circuit may be done with a relatively light load, avoiding even minimal damage to the miniature circuit. The preferred gold plated probe tip assists in eliminating wear and contamination of the probe tip for a longer, durable operative life. Furthermore, the method of making the flexible circuit uses relatively easy, low cost procedures for making flexible circuits with probe tips. The method of the present invention provides high accuracy in positioning and forming each individual probe tip on the flexible circuit.

While the forms of the invention herein disclosed constitute presently preferred embodiments, many others are possible. It is not limited herein to mention all the possible equivalent forms or ramifications of the invention. It is understood that the terms used herein are merely descriptive rather than limiting and that various changes may be made without departing from the spirit or scope of the invention.

We claim:
1. A flexible circuit comprising:
  a flexible insulation layer having an electrical trace composed of a first electrically conductive material; and
  a probe tip that is formed directly to a portion of the electrical trace, the probe tip being composed of a second electrically conductive material that is harder than the first electrically conductive material and having an exposed portion projecting outwardly of the insulation layer;
  wherein the insulation layer includes a cover layer and a substrate layer with the electrical trace located therebetween;
  further comprising a stiffener laminated over at least a portion of the cover layer, wherein the stiffener is made of an insulative material.

2. The flexible circuit of claim 1 wherein the first electrically conductive material has a Vickers hardness in the range of 100 to 120 VPN; and wherein the second electrically conductive material has a Vickers hardness in the range of 180 to 400 VPN.

3. The flexible circuit of claim 1 wherein the first electrically conductive material is copper or a copper alloy and wherein the second electrically conductive material is nickel or a nickel alloy.

4. The flexible circuit of claim 1 wherein the probe tip is plated with gold.

5. A flexible circuit comprising:
  an insulation layer having an electrical trace composed of a first electrically conductive material, the electrical trace having an exposed portion projecting outwardly of the insulation layer; and
  a probe tip formed directly to the exposed portion of the electrical trace, the probe tip comprising an electroplated layer of a second electrically conductive material that is harder than the first electrically conductive material;
  wherein the insulation layer includes a cover layer and a substrate layer with the electrical trace located therebetween; further comprising a stiffener laminated over at. least a portion, of the cover layer. wherein the stiffener is made of an insulative material.

6. A flexible circuit comprising:
  an insulation layer having an electrical trace composed of a first electrically conductive material;
  a probe tip that is formed directly to a portion of the electrical trace, the probe tip being composed of a second electrically conductive material that is harder than the first electrically conductive material and having an exposed portion projecting outwardly of the insulation layer; and
  a ground layer composed of a third electrically conductive material, wherein the ground layer is electrically connected to the electrical trace;
  wherein the insulation layer includes a cover layer, and the flexible circuit comprises a stiffener that is made of an insulative material and laminated over at least a portion of the cover layer.

7. The flexible circuit of claim 6 wherein the third electrically conductive material is copper or a copper alloy.

8. A flexible circuit comprising:
  an insulation layer having an electrical trace composed of a first electrically conductive material; and
  a probe tip that is formed directly to a portion of the electrical trace, the probe rip being composed of a second electrically conductive material that is harder than the first electrically conductive material and having an exposed portion projecting outwardly of the insulation layer;

wherein the insulation layer is a laminate comprising a substrate layer and a cover layer with the electrical trace disposed between the substrate layer and the cover layer;

further comprising a stiffener laminated over at least a portion of the cover layer, wherein the stiffener is made of an insulative material.

9. A flexible circuit comprising:

a flexible insulator;

a plurality of electrical traces each composed of a copper material;

a plurality of probe tips each composed of a nickel material formed directly to respective portions of the electrical traces;

the plurality of probe tips having exposed portions projecting outwardly of the flexible insulator;

the flexible insulator having a cover layer and a substrate layer with the plurality of electrical traces located therebetween; and a stiffener layer composed of an insulative material laminated over at least a portion of the cover.

10. The flexible circuit of claim 9 wherein the plurality of probe tips are formed and attached directly to the respective portions of the plurality of electrical traces by electroplating.

11. The flexible circuit of claim 9 further including a ground layer located between the cover layer and the plurality of electrical traces and an intermediate insulation layer between the ground layer and the plurality of electrical traces.

* * * * *